United States Patent [19]
Coddington et al.

[11] Patent Number: 5,120,191
[45] Date of Patent: Jun. 9, 1992

[54] STACK UNLOADER FOR MOLDED CARRIER RING COMPONENTS

[75] Inventors: David A. Coddington, Binghamton, N.Y.; Randall S. Cole, Brackney, Pa.

[73] Assignee: Universal Instruments Corporation, Binghamton, N.Y.

[21] Appl. No.: 642,385

[22] Filed: Jan. 17, 1991

[51] Int. Cl.$^5$ ............................................. B65G 57/30
[52] U.S. Cl. .............................. 414/797.8; 414/797.4; 414/798.1; 221/94; 221/258; 271/267
[58] Field of Search ............... 414/797.4, 797.9, 797.8, 414/798, 798.1; 271/4, 267–269; 221/94, 264, 116, 251

[56] References Cited

U.S. PATENT DOCUMENTS

| | | | |
|---|---|---|---|
| 3,036,731 | 5/1962 | Cozart | 221/94 |
| 3,335,699 | 8/1967 | Aiken et al. | 414/794.9 X |
| 3,428,215 | 2/1969 | Wells | 221/258 X |
| 3,814,281 | 6/1974 | Shaw | 221/94 X |
| 4,068,767 | 1/1978 | Tippetts | 414/797.9 X |
| 4,255,073 | 3/1981 | Schöttle | 271/267 X |
| 4,457,665 | 7/1984 | Fluck | 414/798 X |
| 4,625,893 | 12/1986 | Rieter et al. | 414/798.1 X |

Primary Examiner—Robert J. Spar
Assistant Examiner—Brian K. Dinicola
Attorney, Agent, or Firm—Wegner, Cantor, Mueller & Player

[57] ABSTRACT

Molded carrier ring-type electrical components are unloaded from a shipping tube by providing the bottom of an escapement mechanism with a substantially flat surface to which the "coin stack" arrangement of components falls during loading of the stack into the escapement. This flat surface presents to the bottom component of the stack an area which is sufficient for preventing dumping of the stack through the escapement and for releveling components which become tilted during loading of the tube into the escapement. The flat surface is biased upwardly by springs and displaceable downwardly against such biasing by a component transfer slide during lateral displacement of the transfer slide to the stack in order to acquire and remove the bottom component from the stack. The slide is particularly configured so that it does not substantially protrude beyond any more than one side of the stack during use, thus providing an unloading main frame that can accommodate an increased density of the stacks for unloading thereof.

8 Claims, 6 Drawing Sheets

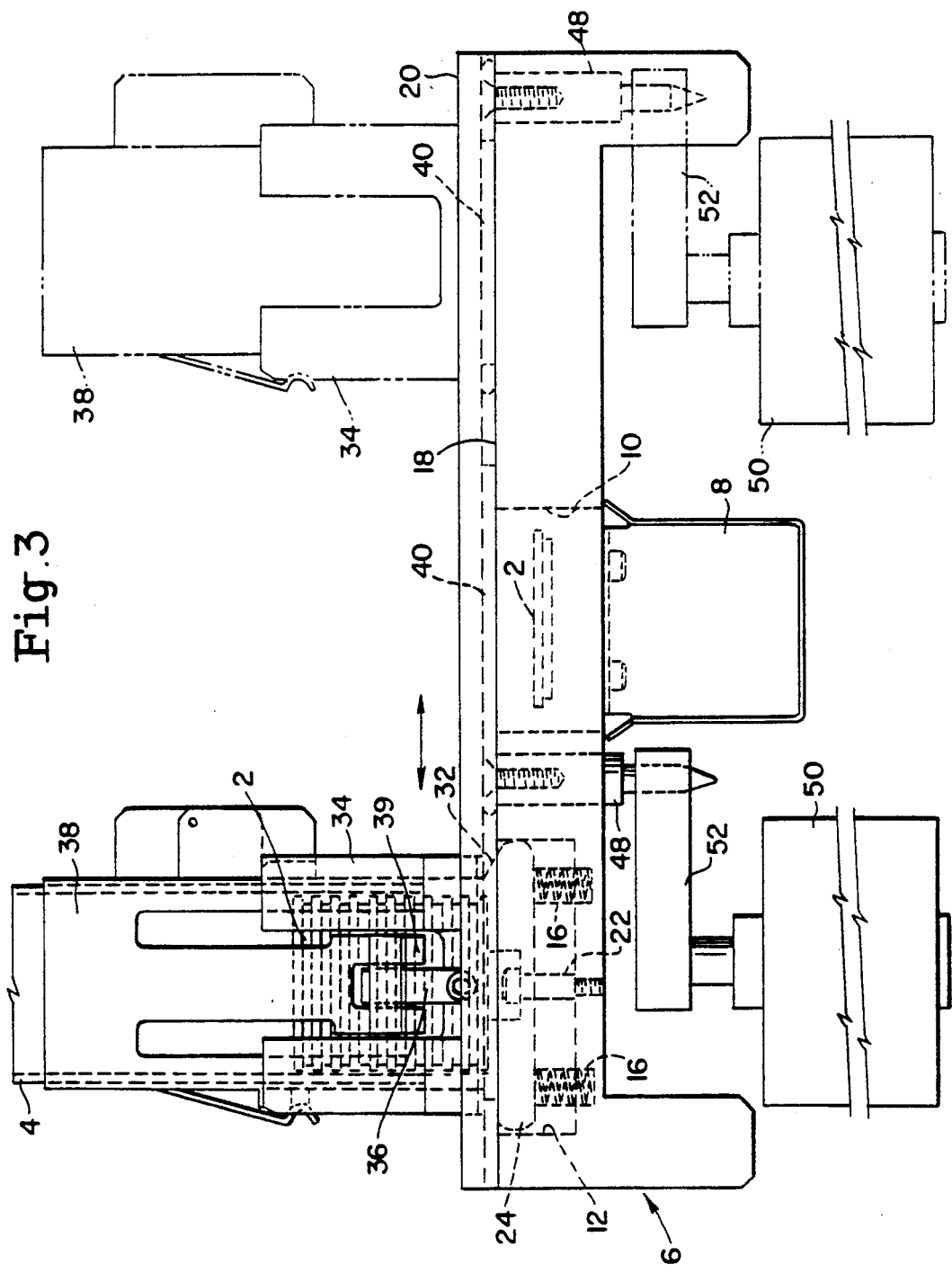

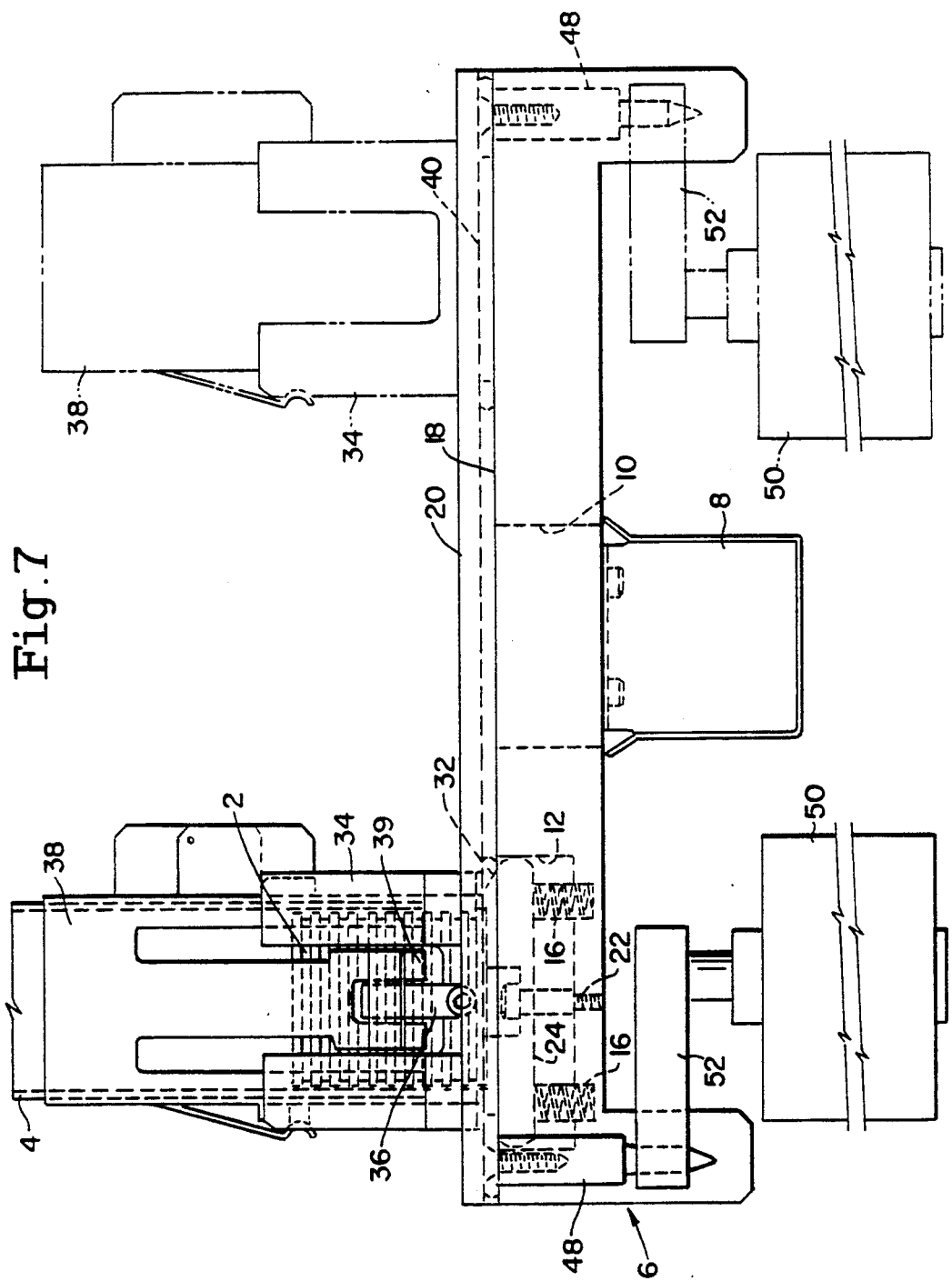

STACK UNLOADER FOR MOLDED CARRIER RING COMPONENTS

BACKGROUND OF THE INVENTION

The invention in the field of component handling and, more particularly, in the unloading of electrical components from supply magazines of the gravity-fed type.

So-called "molded carrier ring" components have a body and a plurality of leads protruding generally coplanarly from the body to a surrounding molded ring. These components are shipped and handled with the ring still attached to the leads in order to provide protection of the leads from bending, breakage, and the like. Just prior to surface mounting of a component onto the substrate of a printed circuit board, the component is presented to a processing station at which, simultaneously, the molded carrier ring is removed and the leads are formed by a punch and die.

Heretofore, gravity fed components have been removed from the bottom of so-called "coin stack" supply tubes by means of an escapement mechanism having two sets of fingers. The sets of fingers of this prior art escapement are situated one above the other so that, upon inserting a supply tube into the escapement, the stack of components drops to the bottom set of fingers. In order to dispense a component from the stack, the bottom set of fingers is opened to release a component and the top set of fingers is moved into interfering relation with the next component of the stack in order to prevent gravity feed of the remainder of the stack.

Generally, in order to prevent loss of components during inversion and loading of the tube into the escapement mechanism, a retainer is attached to a dispensing end of the supply tube and component retaining arms thereof are opened during loading of the retainer and tube into the escapement mechanism so that the components will fall into contact with the bottom set of fingers.

A disadvantage experienced with this prior art is that, during insertion of the tube and retainer into the escapement, the generally flat component packages can tilt while falling from the opened retainer arms to the bottom set of escapement fingers, resulting in one edge of the carrier ring slipping between the bottom fingers and uncontrolled dumping of the whole stack of components through the escapement mechanism.

Thus, it is an object of the instant invention to provide a device by which the components may be dispensed individually from a tube of stacked components, without failure and in a reliable manner.

In another type of prior art escapement mechanism, a blocking plate is situated for the bottom component of the stack to rest upon flatly. During acquisition of a component from the stack, a pocketed device displaces the blocking plate laterally clear of the stack and positions a pocket under the stack for reception of the bottom component. The displaced blocking plate, while so disposed laterally of the stack, limits the closeness with which the dispenser can be situated next to another structure such as an adjoining unloader.

Thus, it is an object of the instant invention to provide a stack unloader which requires less surrounding area for the dispensing mechanism.

Additionally, it is an object of this invention to provide a main frame or table for supporting at least two of the improved unloaders in such a way as to share parts of the main frame and minimize an overall area requirement.

These and other objects of the invention will become more apparent to the artisan upon studying the full disclosure.

SUMMARY OF THE INVENTION

Molded carrier ring-type electrical components are unloaded from a shipping tube by providing the bottom of an escapement mechanism with a substantially flat surface to which the "coin stack" arrangement of components falls during loading of the stack into the escapement. This flat surface presents to the bottom component of the stack an area which is sufficient for preventing dumping of the stack through the escapement and for releveling components which become tilted during loading of the tube into the escapement. The flat surface is biased upwardly by springs and displaceable downwardly against such biasing by a component transfer slide during lateral displacement of the transfer slide to the stack in order to acquire and remove the bottom component from the stack. The slide is particularly configured so that it does not substantially protrude beyond any more than one side of the stack during use, thus providing an unloading main frame that can accommodate an increased density of the stacks for unloading thereof.

BRIEF DESCRIPTION OF THE DRAWINGS

FIG. 3 is a cross sectional view of the main frame device, with one stack of components mounted thereon and another stack indicated in phantom.

FIG. 7 is a view, similar to that of FIG. 3, but with the transfer assembly having a component situated therein for transfer away from the stack.

DETAILED DESCRIPTION OF THE INVENTION

Figure 1:
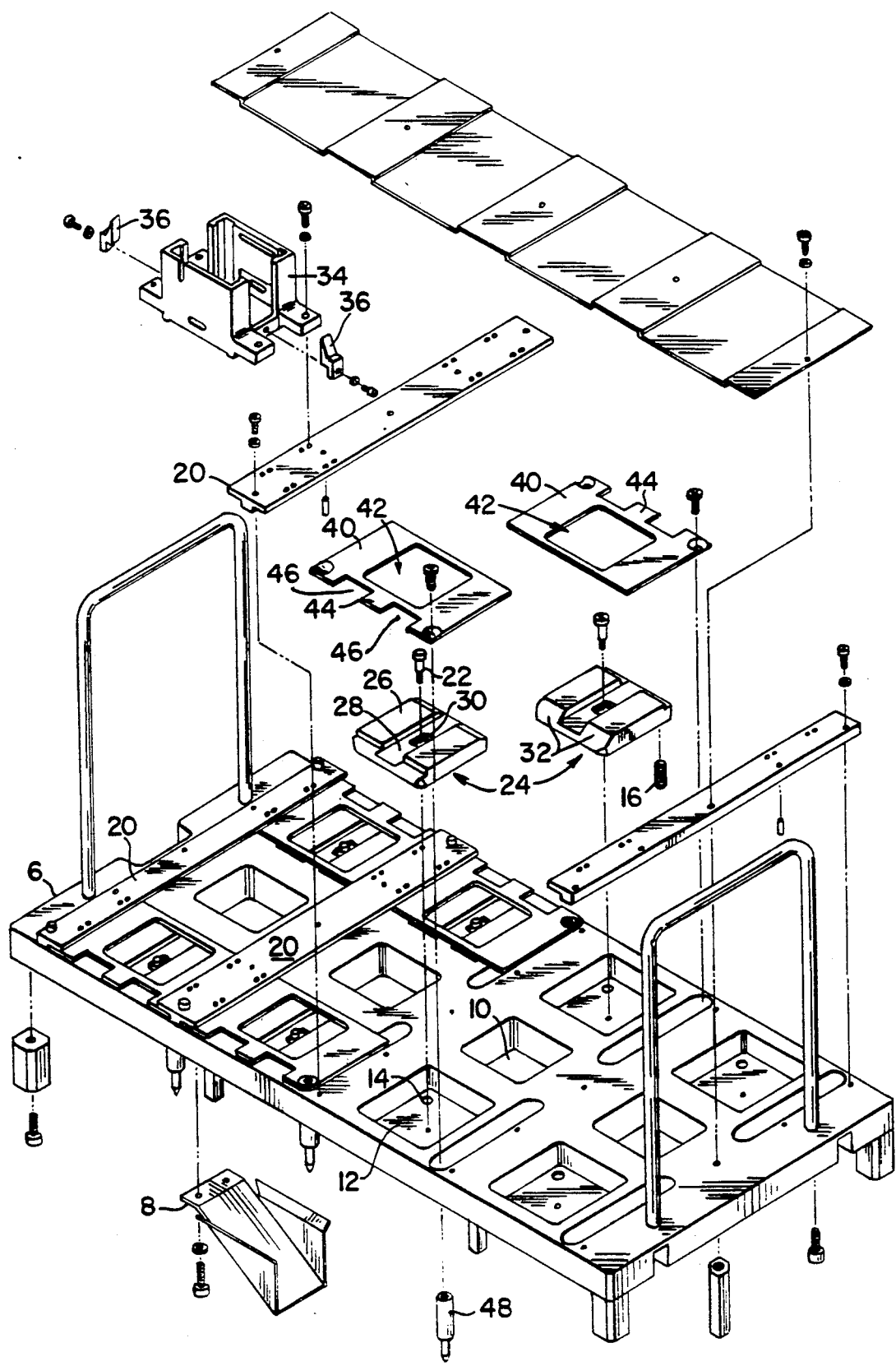
FIG. 1 is an exploded isometric view illustrating a main frame device on which a plurality of the inventive dispensing devices are mountable in high density.

Referring to FIG. 1, a main frame or table 6 can accommodate a plurality of the dispensing devices (illustrated in the remaining Figures) so as to be able to handle, in this case, eight different tubes of stacked molded carrier ring components.

Each of the eight stations has a pocket 12, within which a stop member 24 is retained by a shoulder screw 22, and springs 16 situated in corresponding depressions 14 at the corners of the pocket 12 for biasing the stop member 24 upwardly.

The main frame 6 has guide bars 20 attached thereto for retaining and guiding transfer assembly 40 during movement thereof back and forth along the top surface 18 of main table 6. Transfer assembly 40 is moved back and forth by means of an actuator motor 50 which pivots a link 52 back and forth according to a controller. The link 52 has a slot along its length for receiving the pointed end of a post 48 which depends downwardly from transfer assembly 40.

Attached to the top of guide bars 20 is a holder 34 for holding a tube retainer 38 and the component supply tube 4. Generally, tube retainer 38 is fitted to the dispensing end of a component supply tube 4 in order to retain the components therein during inversion of the tube, with spring metal fingers 39 of the tube retainer 38 preventing discharge of the components 2 from the dispensing end of tube 4.

Upon insertion of tube retainer 38 into holder 34, camming members 36 of holder 34 will engage and open spring fingers 39 thus allowing the components to fall from the spring fingers down to the top surface of stop member 24. With the transfer assembly 40 in the position of FIGS. 6 and 7, the stop member 24 is biased into engagement with the bottom surface of transfer assembly 40 and the bottom-most component 2 of the stack of components rests on the top surface 26 of stop member 24 while being situated within the aperture 42 of transfer assembly 40.

Figure 2:
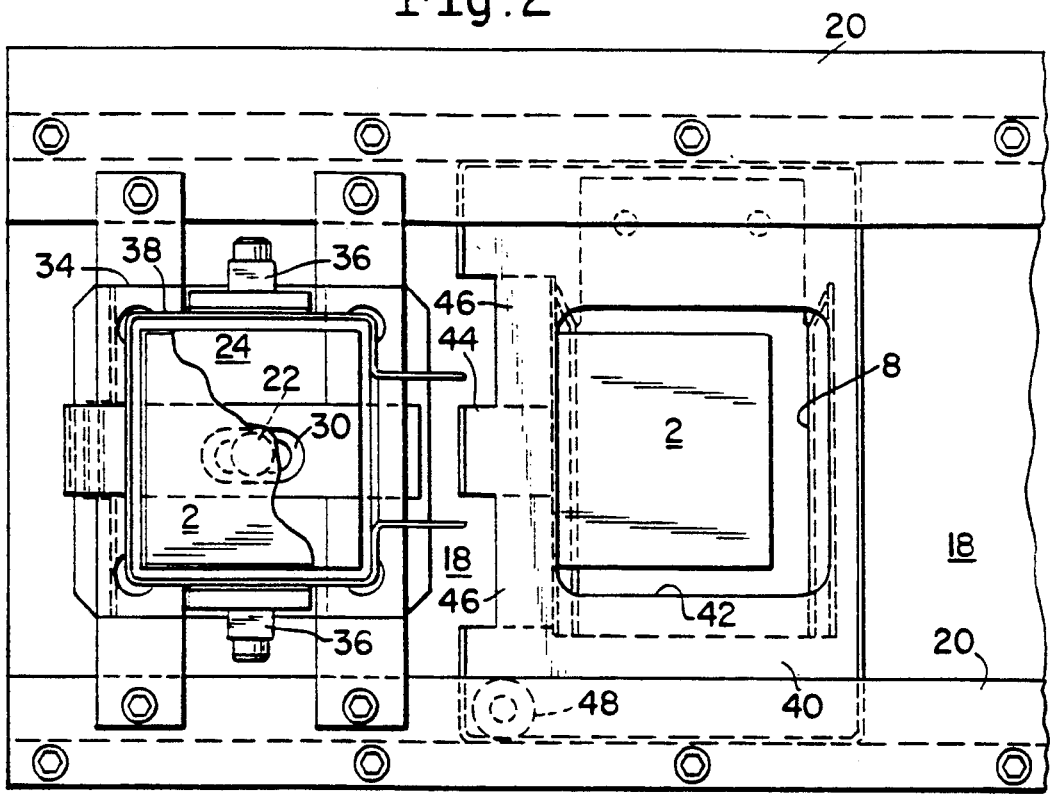
FIG. 2 is a partial top plan view of the device of FIG. 3.

Referring to FIGS. 1 and 2 it may be seen that stop member 24 has a chamfer 32 which cooperates with a tapered undersurface 46 of the transfer assembly 40 during sliding engagement therebetween (FIG. 4) so as to lower stop member 24 against the bias of springs 16. Prior to engagement between these sloping surfaces, a lead-in finger 44 slides ( to the left in FIGS. 2, 3, and 4) into a channel 28 of stop member 24. During this sliding engagement between tapered surfaces 32 and 46, stop member 24 tilts (with the right hand end of FIG. 3 being lower than the left hand end thereof).

Such tilting of stop member 24 could cause tilting of at least the bottom component of the stack if not for finger 44 which supports the edge of the component away from which the tapered edge or chamfer 32 was moved during tilting of stop member 24. Slot 30 in the bottom of channel 28 of stop member 24 (best seen in FIGS. 1 and 2) allows the described tilting to take place while cooperating with shoulder screw 22 to retain the stop member 24 in the pocket 12 of main table 6.

Figure 4:
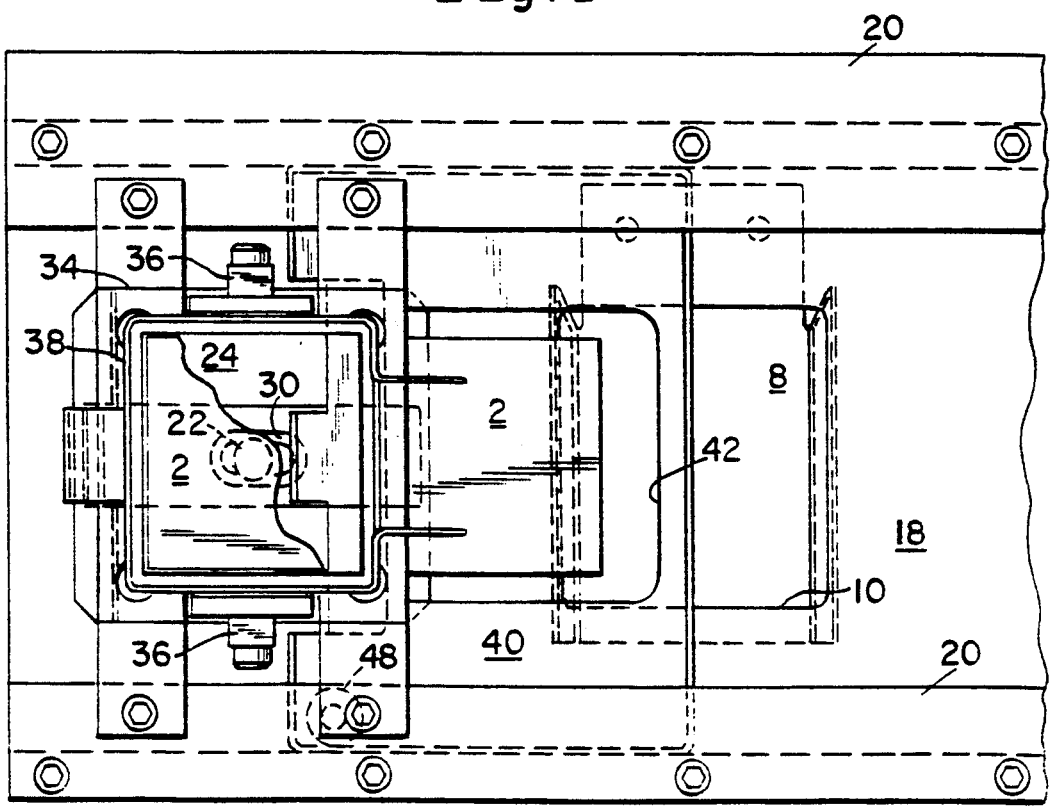
FIG. 4 is a top plan view similar to FIG. 2, with the transfer assembly in a different location.
Figure 5:
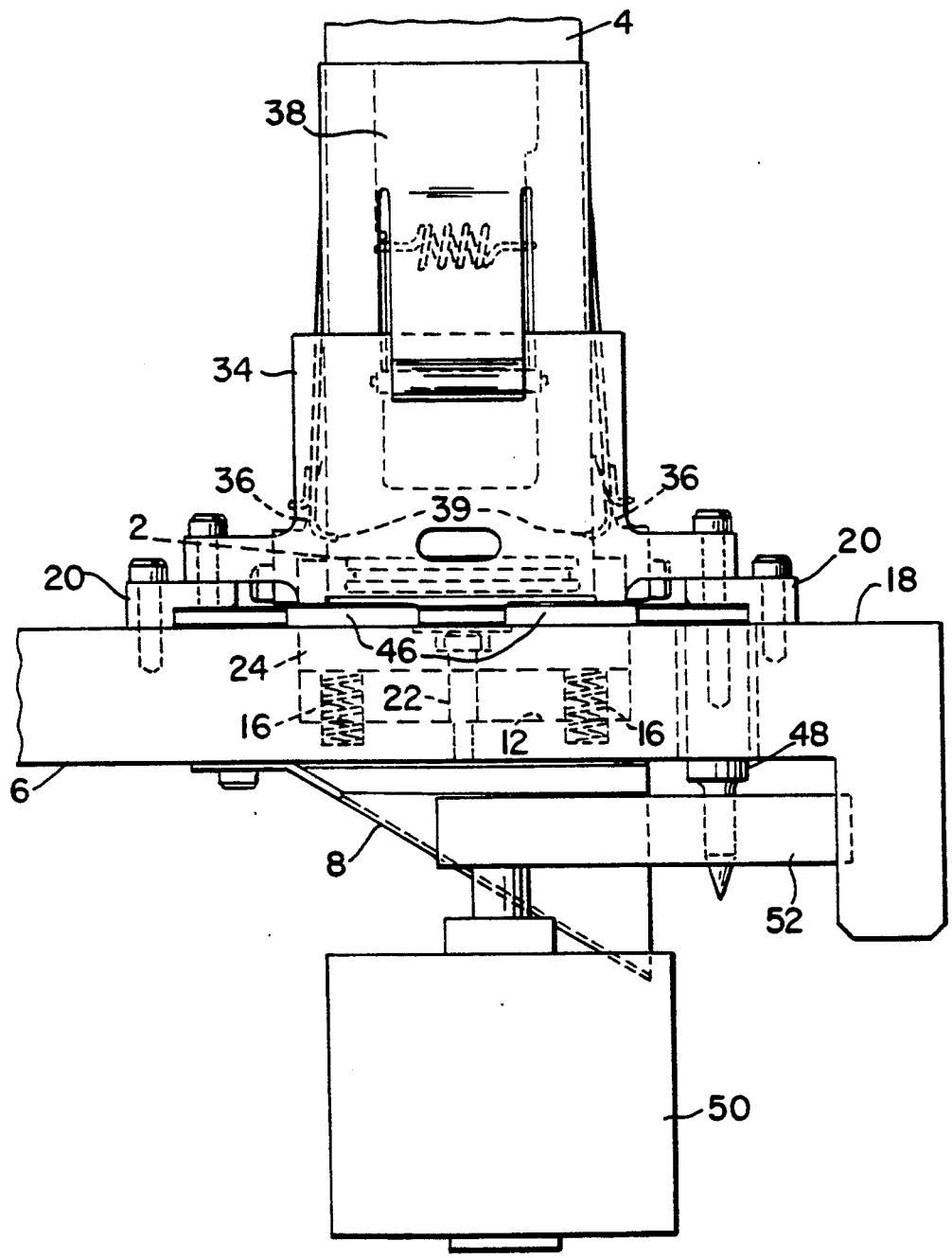
FIG. 5 is a front elevation of the device.

Referring to FIG. 4, a component 2 captured in the aperture 42 and sliding upon surface 18 of table or frame 26 is removed from the stack by sliding transfer assembly 40 away (to the right as seen in the FIG. 4). Upon further sliding of transfer assembly 40 to the position of FIGS. 2 and 3, the component will be free to drop through an aperture 10 of table 6 into a chute 8 for passage to a subsequent processing station. Thereafter, the transfer assembly 40 may be returned back to the stack to acquire another component.

Figure 6:
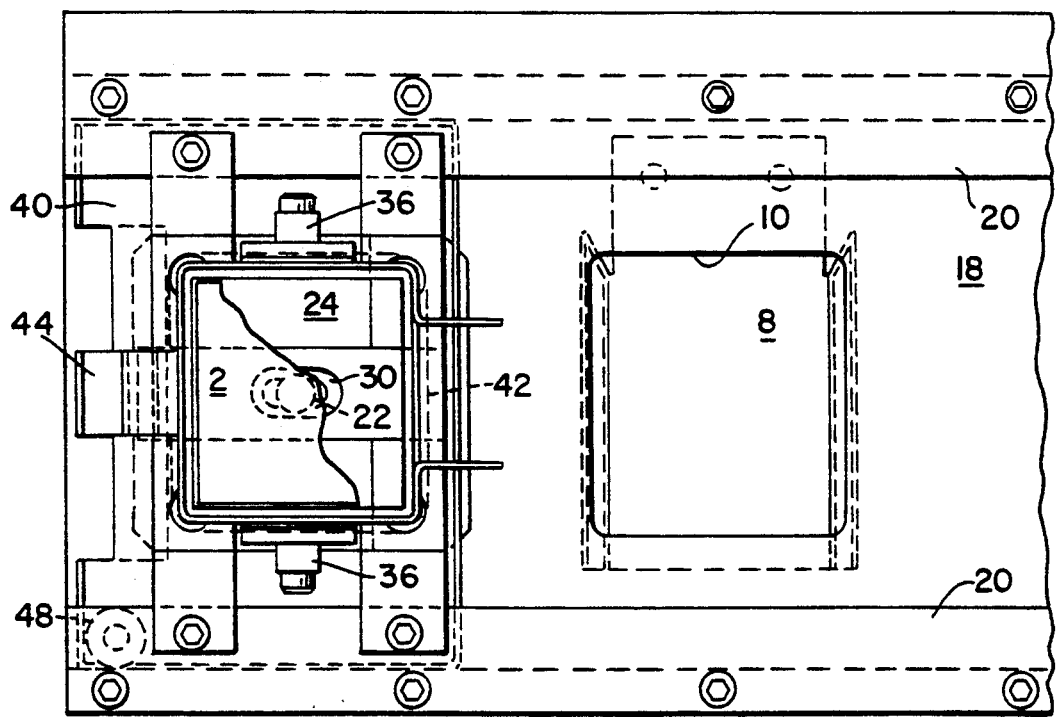
FIG. 6 is a top plan view similar to that of FIGS. 2 and 4, with the transfer assembly in still another location.

As seen in FIGS. 6 and 7, when transfer assembly is situated to receive a component of the stack in aperture 42, there is no substantial extension of the slide 40 beyond the holder 34 of the left (solid line) station.

Another station is indicated in phantom on the right of FIGS. 3 and 7, including another tube retainer 38, holder 34, slide 40, link 52, and actuator 50. With further reference to FIG. 1, it may be seen that two stations are situated at opposite ends of a set of guide bars 20, while sharing the table surface 18 and a chute 8 disposed midway between the stations. This sharing of portions of the main frame or table 6 by at least two stations, along with the above-described structural configuration of each station, allows closer population of stations on the main frame 6 and abutment of two or more such main frames along any portions of their peripheries so as to provide space economies which are much desired in the field of the invention.

A prototype of the invention utilizes a controller, such as one of the programmable computers controlling multi-function automated article handling devices common to the industry of the invention, to synchronize actuation of stations which share a chute so as to insure that there is no interference between the transfer assemblies of those stations.

Thus, it will be seen that the objects set forth above, among those made apparent from the preceding description, are efficiently attained and since certain changes may be made in the construction set forth without departing from the scope of the invention, it is intended that all matter contained in the above description or shown in the accompanying drawings shall be interpreted as illustrative and not in a limiting sense. For instance, it is contemplated that a single transfer slide could be adapted to unload two opposed stations by, for instance, providing lead-in finger 44 and tapered edges 46 on opposite edges of the slide 40 and that it is displaceable back and forth between the stations.

It is to be understood also that the following claims are intended to cover all of the generic and specific features of the invention herein described, and all statements of the scope of the invention which, as a matter of language, might be said to fall therebetween.

Now that the invention has been described, we claim:

1. An escapement mechanism for removing generally flat electrical components one at a time from the bottom of a stack of the components, said components being supplied to said escapement mechanism from a tube, with a longitudinal axis of said tube being oriented generally vertically so as to provide for gravity feed of said components, along a feed path which is generally parallel to said longitudinal axis, and comprising:

stop means for engaging a bottom component of said stack and halting said gravity feed while blocking removal of said components from said mechanism, said stop means having a component engaging portion sufficient to define a plane and to ensure flat seating of a bottom planar surface of said bottom component therewith even when said bottom component initially engages said stop means with said bottom planar surface unparallel to said plane;

means for biasing said stop means upwardly against said bottom component of said stack;

transfer means for moving laterally in and out of said feed path, acquiring said bottom component from said stack, and transferring said bottom component laterally from said stack, said transfer means having upper and lower surfaces; and means for depressing said stop means against a force of said biasing means in order for a portion of said upper and lower surfaces of said transfer means to enter generally between said stop means and said bottom component for said acquiring of said bottom component.

2. An apparatus as in claim 1, wherein said transfer means comprises:

a plate having an aperture into which said bottom component is receivable for said acquiring and transferring 3. An apparatus as in claim 2, and further comprising:

main frame means for supporting at least two of said escapement mechanisms, said main frame means having a generally flat surface along which said plate of each said transfer means is slideable and in which there is an opening means for receiving a component from each transfer means of two oppositely disposed escapement mechanisms.

4. An apparatus as in claim 3, wherein said transfer means does not extend laterally of said longitudinal axis substantially beyond more than one side of said escapement mechanism, even during use, so as to maximize a density of population of said escapement mechanisms on said main frame means.

5. An apparatus as in claim 1, wherein said biasing means comprises:
at least one compression spring situated such that said stop means is tiltable during said acquiring and transferring.

6. An apparatus as in claim 1, wherein said depressing means comprises:
a tapered front edge of said transfer means and a tapered edge of said stop means slidingly engaged by said tapered front edge during movement of said transfer means into position between said stop means and said bottom component.

7. An apparatus as in claim 6, and further comprising:
means for tilting said stop means during entering of said transfer means between said stop means and said bottom component; and
means for limiting tilting of said bottom component during said tilting of said stop means.

8. An apparatus as in claim 7, wherein said means for limiting tilting comprises:
a channel in said component engaging portion of said stop means and a lead-in finger of said transfer means, said lead-in finger being slidingly engageable in and along said channel so as to support progressively more of said bottom component and to limit tilting of said component during tilting of said stop means by said transfer means.

* * * * *